United States Patent
Ryu et al.

(10) Patent No.: US 12,080,459 B2
(45) Date of Patent: Sep. 3, 2024

(54) SYNTHETIC ANTIFERROMAGNET, MAGNETIC TUNNELING JUNCTION DEVICE INCLUDING THE SYNTHETIC ANTIFERROMAGNET, AND MEMORY DEVICE INCLUDING THE MAGNETIC TUNNELING JUNCTION DEVICE

(71) Applicant: Samsung Electronics Co., Ltd., Suwon-si (KR)

(72) Inventors: Jeongchun Ryu, Hwaseong-si (KR); Seungjae Lee, Suwon-si (KR); Naoki Hase, Hwaseong-si (KR); Kwangseok Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 17/847,099

(22) Filed: Jun. 22, 2022

(65) Prior Publication Data
US 2023/0207177 A1    Jun. 29, 2023

(30) Foreign Application Priority Data

Dec. 28, 2021   (KR) .......... 10-2021-0190394
Jun. 15, 2022   (KR) .......... 10-2022-0073057

(51) Int. Cl.
*G11C 11/16*      (2006.01)
*H01F 10/32*      (2006.01)
(Continued)

(52) U.S. Cl.
CPC ........ *H01F 10/3272* (2013.01); *G11C 11/161* (2013.01); *H01F 10/3286* (2013.01);
(Continued)

(58) Field of Classification Search
CPC .............. G11C 11/161; H01F 10/3272; H01F 10/3286; H10B 61/00; H10N 50/85; H10N 50/10
(Continued)

(56) References Cited

U.S. PATENT DOCUMENTS 8,338,004 B2   12/2012   Shin et al.
10,032,978 B1   7/2018   Schabes et al.
(Continued)

FOREIGN PATENT DOCUMENTS

CN   111799369 A   10/2020
JP   2011-138954 A   7/2011
(Continued)

OTHER PUBLICATIONS

Young-Wan Oh et al., 'Field-free switching of perpendicular magnetization through spin-orbit torque in antiferromagnet/ferromagnet/oxide structures,' Nature Nanotechnology, vol. 11, Oct. 2016, pp. 878-885.
(Continued)

Primary Examiner — Ly D Pham
(74) Attorney, Agent, or Firm — Harness, Dickey & Pierce, P.L.C.

(57) ABSTRACT

A synthetic antiferromagnet includes a first ferromagnetic layer having a first surface; a second ferromagnetic layer having a second surface facing the first surface of the first ferromagnetic layer; and a first non-magnetic layer disposed between the first ferromagnetic layer and the second ferromagnetic layer, wherein the first ferromagnetic layer has an inclined perpendicular magnetic anisotropy (PMA) in which a magnetization direction of the first ferromagnetic layer is inclined from a first direction perpendicular to the first surface and the second surface, a component in a first direction of the magnetization direction of the first ferro-
(Continued)

magnetic layer and a component in a first direction of a magnetization direction of the second ferromagnetic layer are opposite to each other.

36 Claims, 11 Drawing Sheets

(51) Int. Cl.
*H10B 61/00* (2023.01)
*H10N 50/10* (2023.01)
*H10N 50/85* (2023.01)

(52) U.S. Cl.
CPC ............ *H10B 61/00* (2023.02); *H10N 50/10* (2023.02); *H10N 50/85* (2023.02)

(58) Field of Classification Search
USPC ........................................................ 365/158
See application file for complete search history.

(56) References Cited

U.S. PATENT DOCUMENTS

| | | | |
|---|---|---|---|
| 2014/0009994 A1* | 1/2014 | Parkin | H01F 10/3218 365/80 |
| 2015/0056368 A1 | 2/2015 | Wang et al. | |
| 2015/0129995 A1 | 5/2015 | Wang et al. | |
| 2015/0171316 A1 | 6/2015 | Park et al. | |
| 2017/0316813 A1 | 11/2017 | Lee et al. | |
| 2017/0331032 A1 | 11/2017 | Chen et al. | |
| 2018/0114898 A1 | 4/2018 | Lee | |
| 2019/0355401 A1 | 11/2019 | Shiokawa | |
| 2020/0066968 A1 | 2/2020 | Park et al. | |
| 2020/0365308 A1 | 11/2020 | Lin et al. | |
| 2022/0392505 A1* | 12/2022 | Stewart | G11C 11/1675 |
| 2023/0083008 A1* | 3/2023 | Igarashi | H10N 50/85 257/427 |

FOREIGN PATENT DOCUMENTS

| | | |
|---|---|---|
| JP | 5445029 B2 | 3/2014 |
| KR | 10-1178767 B1 | 9/2012 |

OTHER PUBLICATIONS

Shunsuke Fukami et al., 'Magnetization switching by spin-orbit torque in an antiferromagnet-ferromagnet bilayer system,' *Nature Materials*, vol. 15, May 2016, pp. 535-542.

Guoqjang Yu et al., 'Switching of perpendicular magnetization by spin-orbit torques in the absence of external magnetic fields,' *Nature Nanotechnology*, vol. 9, Jul. 2014, pp. 548-554.

Zachary R. Nunn et al., 'Control of the noncollinear interlayer exchange coupling,' *Science Advances*, vol. 6, Nov. 25, 2020, pp. 1-7.

Extended European Search Report dated Dec. 12, 2022 issued in European Patent Application No. 22184097.8-1211.

E.A. Tremsina, et al. "Micromagnetic analysis and optimization of spin-orbit torque switching processes in synthetic antiferromagnets," Journal of Applied Physics, vol. 126, No. 16, XP012241785, pp. 1-6 (2019).

BingJin Chen, et al. "Design parameters for field-free spin-orbit torque switching of perpendicular synthetic antiferromagnets," Journal of Applied Physics, American Institute of Physics, vol. 129, No. 16., XP012255887, pp. 1-9 (2021).

Amalio Fernnandez-Pacheco, et al. "Symmetry-Breaking Interlayer Dzyaloshinskii-Moriya Interactions in Synthetic Antiferromagnets," arxiv.org, Cornell University Library, XP081055606, pp. 1-15 (2018).

Dong-Soo Han, et al. "Chiral magnetic interlayer interaction in synthetic antiferromagnets," arxiv.org, Cornell University Library, XP081491624, pp. 1-24 (2018).

* cited by examiner

SYNTHETIC ANTIFERROMAGNET, MAGNETIC TUNNELING JUNCTION DEVICE INCLUDING THE SYNTHETIC ANTIFERROMAGNET, AND MEMORY DEVICE INCLUDING THE MAGNETIC TUNNELING JUNCTION DEVICE

CROSS-REFERENCE TO RELATED APPLICATION

This application is based on and claims priority under 35 U.S.C. § 119 to Korean Patent Application No. 10-2021-0190394, filed on Dec. 28, 2021, and Korean Patent Application No. 10-2022-0073057, filed on Jun. 15, 2022 in the Korean Intellectual Property Office, the disclosure of which is incorporated by reference herein in its entirety.

BACKGROUND

Some example embodiments relate to synthetic antiferromagnets, magnetic tunneling junction devices including the synthetic antiferromagnets, and/or memory devices including the magnetic tunneling junction devices.

A magnetic memory device such as magnetic random access memory (MRAM) stores data by using a change in the resistance of a magnetic tunneling junction device. The resistance of the magnetic tunneling junction device varies with the magnetization direction of a free layer. For example, when the magnetization direction of the free layer is the same as or parallel with the magnetization direction of a pinned layer, the magnetic tunneling junction device may have a low resistance, and when the magnetization directions are opposite to or antiparallel with each other, the magnetic tunneling junction device may have a high resistance. When this characteristic is used in a memory device, for example, the magnetic tunneling junction device having a low resistance may correspond to data '0' and the magnetic tunneling junction device having a high resistance may correspond to data '1'.

Such a magnetic memory device has advantages such as non-volatility, high-speed operation, and/or high durability. For example, spin transfer torque-magnetic RAM (STT-MRAM) that is currently mass-produced may have an operating speed of about 50 nsec to 100 nsec and also may have excellent data retention greater than or equal to 10 years. Alternatively or additionally, spin-orbit torque (SOT)-MRAM may have a very fast operation speed less than or equal to 10 nsec, which is faster than the STT-MRAM because a spin polarization direction is perpendicular to the magnetization direction. Moreover, the SOT-MRAM may have more stable durability because a path of a write current and a path of a read current are different from each other. However, the SOT-MRAM requires or uses an external magnetic field for selective magnetic switching.

SUMMARY

Provided are synthetic antiferromagnets capable of selective magnetic switching even without an external magnetic field is applied thereto, magnetic tunneling junction devices including the synthetic antiferromagnets, and/or memory devices including the magnetic tunneling junction devices.

Additional aspects will be set forth in part in the description which follows and, in part, will be apparent from the description, or may be learned by practice of the various example embodiments.

According to some example embodiments, a synthetic antiferromagnet includes a first ferromagnetic layer having a first surface; a second ferromagnetic layer having a second surface facing the first surface of the first ferromagnetic layer; and a first non-magnetic layer disposed between the first ferromagnetic layer and the second ferromagnetic layer. The first ferromagnetic layer has an inclined perpendicular magnetic anisotropy (PMA) in which a magnetization direction of the first ferromagnetic layer is inclined from a first direction that is perpendicular to the first surface and the second surface. A component in the first direction of the magnetization direction of the first ferromagnetic layer and a component in the first direction of a magnetization direction of the second ferromagnetic layer are opposite to each other.

The magnetization direction of the first ferromagnetic layer may be configured to change according to a direction of a current applied to the first ferromagnetic layer.

The magnetization direction of the second ferromagnetic layer may be configured to change according to the magnetization direction of the first ferromagnetic layer.

The second ferromagnetic layer may have an inclined PMA in which the magnetization direction of the second ferromagnetic layer is inclined from the first direction that is perpendicular to the first surface and the second surface.

The magnetization direction of the first ferromagnetic layer and the magnetization direction of the second ferromagnetic layer may be antiparallel to each other.

When a direction parallel to the first surface and the second surface is defined as a second direction, a first component in the second direction of the magnetization direction of the first ferromagnetic layer and a second component in the second direction of the magnetization direction of the second ferromagnetic layer may be opposite to each other.

An inclination angle of magnetic anisotropy of the first ferromagnetic layer with respect to the first direction may be about 1 degrees to about 30 degrees.

The first non-magnetic layer may include a conductive metal having a Dzyaloshinskii-Moriya interaction with the first ferromagnetic layer and the second ferromagnetic layer.

A first intensity of the Dzyaloshinskii-Moriya interaction on an interface between the first non-magnetic layer and the first ferromagnetic layer may be different from a second intensity of the Dzyaloshinskii-Moriya interaction on an interface between the first non-magnetic layer and the second ferromagnetic layer.

The first non-magnetic layer may include at least one of ruthenium (Ru), aluminum (Al), tantalum (Ta), platinum (Pt), tungsten (W), palladium (Pd), zirconium (Zr), copper (Cu), or an alloy containing the same.

A thickness of the first non-magnetic layer may be in the range of about 0.1 nm to about 10 nm.

Each of the first ferromagnetic layer and the second ferromagnetic layer may include an alloy of a ferromagnetic metal and a non-magnetic metal.

The ferromagnetic metal may include at least one of iron (Fe), cobalt (Co), or nickel (Ni), and the non-magnetic metal may include at least one of boron (B), silicon (Si), zirconium (Zr), platinum (Pt), palladium (Pd), copper (Cu), or tungsten (W).

A ratio of the ferromagnetic metal in each of the first ferromagnetic layer and the second ferromagnetic layer may be in the range of about 20 at % to about 100 at %.

A first thickness of the first ferromagnetic layer and a second thickness of the second ferromagnetic layer may be the same or different, and may be in the range of about 1 nm to about 10 nm.

A first thickness of the second ferromagnetic layer may be greater than a second thickness of the first ferromagnetic layer.

The synthetic antiferromagnet may further include a second non-magnetic layer disposed on a third surface opposite the first surface of the first ferromagnetic layer, and the second non-magnetic layer may include a transition metal having a Dzyaloshinskii-Moriya interaction with the first ferromagnetic layer.

The second non-magnetic layer may include at least one of platinum (Pt), tungsten (W), tantalum (Ta), or an alloy containing the same.

According to some example embodiments, a magnetic tunneling junction device includes a pinned layer having a fixed magnetization direction; a synthetic antiferromagnet having a variable magnetization direction; and an oxide layer disposed between the pinned layer and the synthetic antiferromagnet. The synthetic antiferromagnet includes a first ferromagnetic layer having a first surface; a second ferromagnetic layer having a second surface facing the first surface of the first ferromagnetic layer; and a first non-magnetic layer disposed between the first ferromagnetic layer and the second ferromagnetic layer. The first ferromagnetic layer has an inclined perpendicular magnetic anisotropy (PMA) in which a magnetization direction of the first ferromagnetic layer is inclined from a first direction that is perpendicular to the first surface and the second surface, a first component in the first direction of the magnetization direction of the first ferromagnetic layer and a second component in the first direction of a magnetization direction of the second ferromagnetic layer are opposite to each other. The synthetic antiferromagnet is disposed so that the second ferromagnetic layer is adjacent to the oxide layer. The first ferromagnetic layer has higher electrical conductivity than electrical conductivity of the second ferromagnetic layer.

According to some example embodiments, a memory device includes a plurality of magnetic tunneling junction devices and a plurality of memory cells each including a switching device connected to a respective one of the plurality of magnetic tunneling junction devices. At least one of the plurality of magnetic tunneling junction device includes a pinned layer having a fixed magnetization direction; a synthetic antiferromagnet having a variable magnetization direction; and an oxide layer between the pinned layer and the synthetic antiferromagnet. The synthetic antiferromagnet includes a first ferromagnetic layer having a first surface; a second ferromagnetic layer having a second surface facing the first surface of the first ferromagnetic layer; and a first non-magnetic layer disposed between the first ferromagnetic layer and the second ferromagnetic layer. The first ferromagnetic layer has an inclined perpendicular magnetic anisotropy (PMA) in which a magnetization direction of the first ferromagnetic layer is inclined from a first direction that is perpendicular to the first surface and the second surface, a first component in the first direction of the magnetization direction of the first ferromagnetic layer and a second component in the first direction of a magnetization direction of the second ferromagnetic layer are opposite to each other, The synthetic antiferromagnet is arranged so that the second ferromagnetic layer is adjacent to the oxide layer. The first ferromagnetic layer has higher electrical conductivity than electrical conductivity of the second ferromagnetic layer.

According to some example embodiments, a synthetic antiferromagnet may include a first ferromagnetic layer having a first surface; and a second ferromagnetic layer having a second surface facing the first surface of the first ferromagnetic layer. The first ferromagnetic layer has an inclined perpendicular magnetic anisotropy (PMA) in which a magnetization direction of the first ferromagnetic layer is inclined from a first direction that is perpendicular to the first surface and the second surface, and a first component of a projection of the magnetization direction of the first ferromagnetic layer onto the first direction and a second component in the first direction of a projection of the magnetization direction of the second ferromagnetic layer are antiparallel with each other.

According to some example embodiments, a memory cell may include the synthetic antiferromagnet and a switching device comprising a first source/drain electrode connected to the synthetic antiferromagnet.

According to some example embodiments, a memory device may include the memory cell, a word line connected to a gate electrode of the memory cell, and a selection line connected to a second source/drain electrode of the memory cell.

The magnetization direction of the first ferromagnetic layer is configured to change according to a direction of a current applied to the first ferromagnetic layer, and the magnetization direction of the second ferromagnetic layer is configured to change according to the magnetization direction of the first ferromagnetic layer.

A first non-magnetic layer may be between the first ferromagnetic layer and the second ferromagnetic layer.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION OF VARIOUS EXAMPLE EMBODIMENTS

Figure 1:
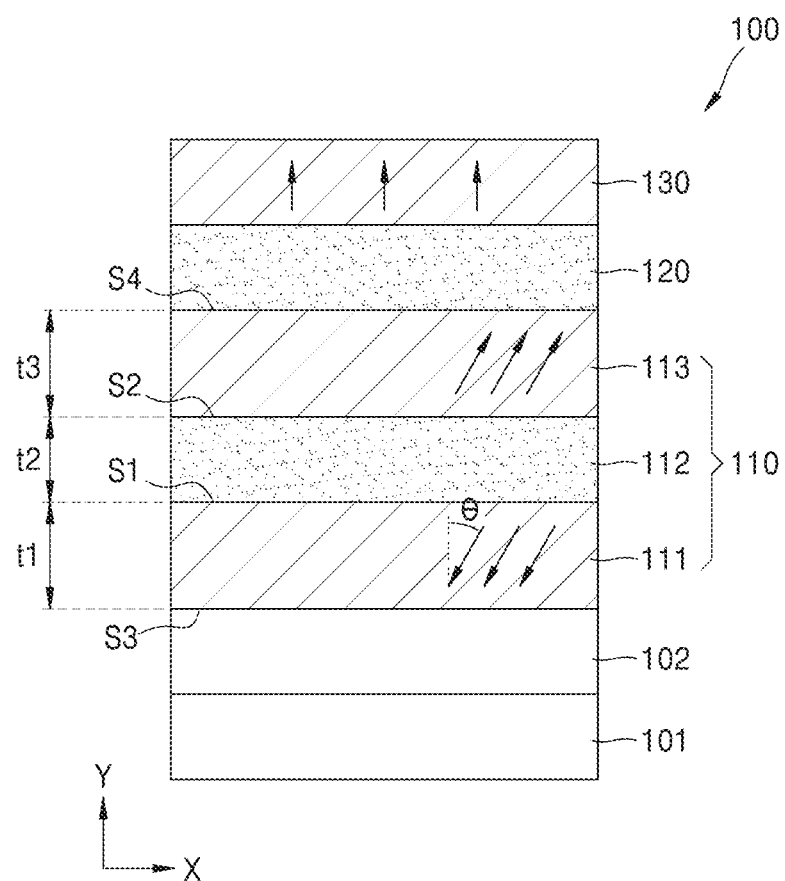
FIG. 1 is a cross-sectional view illustrating schematic structures of a synthetic antiferromagnet and a magnetic tunneling junction device according to some example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a synthetic antiferromagnet, a magnetic tunneling junction device including the synthetic antiferromagnet, and a memory device including the magnetic tunneling junction device will be described in detail. Like reference numerals refer to like elements throughout, and in the drawings, sizes of elements may be exaggerated for clarity and convenience of explanation. The embodiments described below are merely exemplary, and various modifications may be possible from the embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. Example embodiments are not limited to the order the operations are mentioned.

The term used in the embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view illustrating schematic structures of a synthetic antiferromagnet 110 and a magnetic tunneling junction device 100 according to some example embodiments. Referring to FIG. 1, the magnetic tunneling junction device 100 may include the synthetic antiferromagnet 110, an oxide layer 120 disposed on the synthetic antiferromagnet 110, and a pinned layer 130 disposed on the oxide layer 120. If necessary or desirable, the magnetic tunneling junction device 100 may further include a seed layer 101 and a buffer layer 102 disposed on the seed layer 101. The buffer layer 102 may serve to assist magnetization of the synthetic antiferromagnet 110. The synthetic antiferromagnet 110 may be disposed on the buffer layer 102.

Here, the expression "disposed on" is for convenience of description and does not necessarily mean a vertical relationship. For example, the oxide layer 120 may be disposed between the pinned layer 130 and the synthetic antiferromagnet 110. The synthetic antiferromagnet 110 may be disposed between the buffer layer 102 and the oxide layer 120.

The pinned layer 130 may include a ferromagnetic metal material having magnetism. For example, the pinned layer 130 may include at least one ferromagnetic material selected from the group consisting of or including iron (Fe), cobalt (Co), nickel (Ni), manganese (Mn), a Fe-containing alloy, a Co-containing alloy, a Ni-containing alloy, a Mn-containing alloy and a Heusler alloy. The pinned layer 130 may have a pinned magnetization direction. The pinned layer 130 may have high perpendicular magnetic anisotropy (PMA). In other words, the perpendicular magnetic anisotropy energy of the pinned layer 130 may exceed out-of-plane demagnetization energy. In this case, the magnetic moment of the pinned layer 130 may be stabilized in a thickness direction (Y direction) or a direction perpendicular to a layer direction (X direction).

The oxide layer 120 may serve as a tunnel barrier layer for a magnetic tunneling junction. The oxide layer 120 may include crystalline Mg oxide. For example, the oxide layer 120 may include MgO, $MgAl_2O_4$, or $MgTiO_x$.

The synthetic antiferromagnet 110 may serve as a free layer having a variable magnetization direction. The synthetic antiferromagnet 110 may include a first ferromagnetic layer 111, a non-magnetic layer 112 disposed on the first ferromagnetic layer 111, and a second ferromagnetic layer 113 disposed on the non-magnetic layer 112. For example, the first ferromagnetic layer 111 and the second ferromagnetic layer 113 may be disposed such that a first surface S1 of the first ferromagnetic layer 111 and a second surface S2 of the second ferromagnetic layer 113 face each other, and the non-magnetic layer 112 may be disposed between the first ferromagnetic layer 111 and the second ferromagnetic layer 113. Also, the first ferromagnetic layer 111 may be disposed such that a third surface S3 opposite to the first surface S1 is in contact with an upper surface of the buffer layer 102. The second ferromagnetic layer 113 may be disposed such that a fourth surface S4 opposite to the second surface S2 is in contact with a lower surface of the oxide layer 120.

The first ferromagnetic layer 111 and the second ferromagnetic layer 113 may include an alloy of a ferromagnetic metal and a non-magnetic metal. For example, the ferromagnetic metal may include at least one of iron (Fe), cobalt (Co), or nickel (Ni), and the non-magnetic metal may include at least one of boron (B), silicon (Si), zirconium (Zr), platinum (Pt), palladium (Pd), copper (Cu), or tungsten (W). The non-magnetic layer 112 may include a conductive metal that generates or is configured to generate a Dzyaloshinskii-Moriya interaction on an interface with the first ferromagnetic layer 111 and an interface with the second ferromagnetic layer 113. For example, the non-magnetic layer 112 may include at least one of ruthenium (Ru), aluminum (Al), tantalum (Ta), platinum (Pt), tungsten (W), palladium (Pd), zirconium (Zr), copper (Cu), or an alloy including the same.

In such a structure of the synthetic antiferromagnet 110, the first ferromagnetic layer 111 and the second ferromagnetic layer 113 form an antiferromagnet by Ruderman-Kittel-Kasuya-Yosida (RKKY) interaction by means of or based on the non-magnetic layer 112. For example, the synthetic antiferromagnet 110 may have a stable state when the magnetization direction of the first ferromagnetic layer 111 and the magnetization direction of the second ferromagnetic layer 113 are opposite to each other, or point in directions opposite to one another. The strength of the magnetization of the first ferromagnetic layer 111 and the strength of magnetization of the second ferromagnetic layer 113 may be the same in magnitude and may have an inner product that is zero or close to zero; however, example embodiments are not necessarily limited thereto, and the strength of the magnetization the first ferromagnetic layer 111 may be greater than or less than strength of magnetization of the second ferromagnetic layer 113. In addition, an arrangement of magnetization states of the first ferromagnetic layer 111 and the second ferromagnetic layer 113 may be determined as a stable state by the Dzyaloshinskii-Moriya interaction occurring on the interface between the non-magnetic layer 112 and the first ferromagnetic layer 111 and the interface between the non-magnetic layer 112 and the second ferromagnetic layer 113. The Dzyaloshinskii-Moriya interaction represents or corresponds to a property in which a magnetization direction of a ferromagnetic material rotates clockwise or counterclockwise according to an intensity of a spin-orbit interaction occurring on an interface between the non-magnetic metal and the ferromagnetic material. Therefore, when the non-magnetic layer 112 including a metal material that is prone to the Dzyaloshinskii-Moriya interaction on the interface with the ferromagnetic material is disposed between the first ferromagnetic layer 111 and the second ferromagnetic layer 113, it is possible to design or have the synthetic antiferromagnet 110 having magnetic anisotropy inclined from a first direction (e.g. Y direction) that is perpendicular to a second direction (X direction) corresponding to the first to fourth surfaces S1, S2, S3, and S4 parallel to the first to fourth surfaces S1, S2, S3, and S4, the inclination based on the RKKY interaction and the Dzyaloshinskii-Moriya interaction.

According to some example embodiments, as indicated by arrows in FIG. 1, the magnetization directions of the first ferromagnetic layer 111 and the second ferromagnetic layer 113 are opposite to each other, e.g. are antiparallel with each other. In addition, the magnetization directions of the first ferromagnetic layer 111 and the second ferromagnetic layer 113 are inclined from the first direction (Y direction) to the second direction (X direction). For example, the first ferromagnetic layer 111 and the second ferromagnetic layer 113 may have inclined PMA with respect to the first direction (Y direction). When both the first ferromagnetic layer 111 and the second ferromagnetic layer 113 have inclined PMA, a component in the first direction (Y direction), or a component of a projection onto the Y direction of the magnetization direction of the first ferromagnetic layer 111 and a component in the first direction (Y direction), or a component of a projection onto the Y direction of the magnetization direction of the second ferromagnetic layer 113 may be opposite to each other, and a component in the second direction (X direction) or a component of a projection onto the X direction of the magnetization direction of the first ferromagnetic layer 111 and the component in the second direction (X direction) or a component of a projection onto the X direction in the magnetization direction of the second ferromagnetic layer 113 may also be opposite to each other. For example, the magnetization direction of the first ferromagnetic layer 111 and the magnetization direction of the second ferromagnetic layer 113 may be antiparallel to each other. However, when both the first ferromagnetic layer 111 and the second ferromagnetic layer 113 have inclined PMA, a degree of inclination of the magnetization direction of the first ferromagnetic layer 111 with respect to the first direction (Y direction) and a degree of inclination of the magnetization direction of the second ferromagnetic layer 113 with respect to the first direction (Y direction) are not necessarily the same. For example, the degree of inclination of the magnetization direction of the first ferromagnetic layer 111 with respect to the first direction (Y direction) may be different from the degree of inclination of the magnetization direction of the second ferromagnetic layer 113.

Meanwhile, both the first ferromagnetic layer 111 and the second ferromagnetic layer 113 are illustrated as having inclined PMA in FIG. 1, but example embodiments are not limited thereto. According to some example embodiments, only the first ferromagnetic layer 111 may have inclined PMA and the second ferromagnetic layer 113 may have general PMA. For example, the second ferromagnetic layer 113 may have PMA that is not inclined with respect to the first direction (Y direction). Hereinafter, for convenience, a case in which the second ferromagnetic layer 113 also has inclined PMA will be described.

Figure 2:
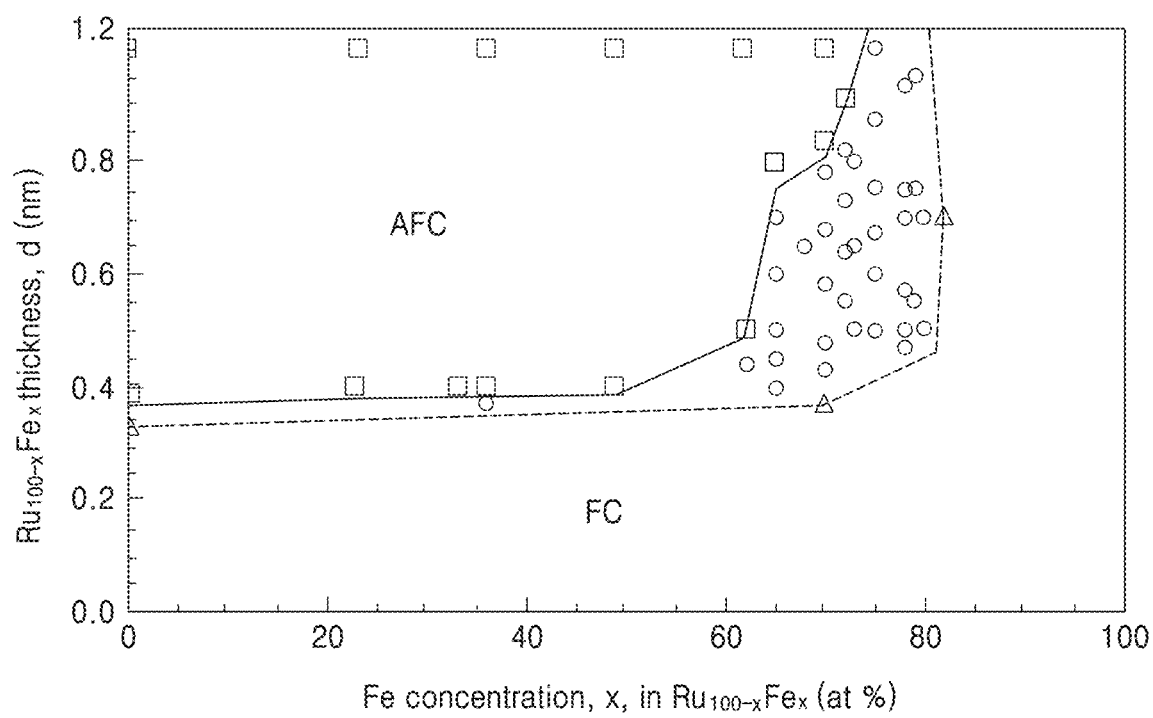
FIG. 2 is a graph illustrating magnetization states according to material compositions and thicknesses of first and second ferromagnetic layers.

An angle θ between the magnetization directions of the first ferromagnetic layer 111 and the second ferromagnetic layer 113 with the first direction (Y direction) may vary depending on material properties and/or thicknesses of the first ferromagnetic layer 111, the non-magnetic layer 112, and the second ferromagnetic layer 113. Material properties of the first ferromagnetic layer 111 and/or the second ferromagnetic layer 113 may vary depending on material compositions of the ferromagnetic metal and the non-magnetic metal. FIG. 2 is a graph illustrating magnetization states according to material compositions and thicknesses of the first and second ferromagnetic layers 111 and 113. In FIG. 2, a horizontal axis represents concentration of iron (Fe) in the first and second ferromagnetic layers 111 and 113 including iron (Fe) and ruthenium (Ru), and a vertical axis represents thicknesses of the first and second ferromagnetic layers 111 and 113. Also, in FIG. 2, a region where antiferromagnetic coupling occurs is denoted by AFC, a region where ferromagnetic coupling occurs is denoted by FC, and a region where non-collinear coupling occurs is denoted by NC. Referring to FIG. 2, in the NC region between the AFC region and the FC region, the first ferromagnetic layer 111 and the second ferromagnetic layer 113 may have inclined magnetic anisotropy.

Accordingly, the inclination angle θ of magnetic anisotropy of the first ferromagnetic layer 111 and the second ferromagnetic layer 113 with respect to the first direction (Y direction) may be adjusted according to materials and/or thicknesses of any or either of the first ferromagnetic layer 111, the non-magnetic layer 112, and the second ferromagnetic layer 113. For example, a ratio (a composition ratio) of the ferromagnetic metal in each of the first ferromagnetic layer 111 and the second ferromagnetic layer 113 may vary depending on ferromagnetic metals and non-magnetic metals used in the first ferromagnetic layer 111 and the second ferromagnetic layer 113, but the ratio may generally be in the range of about 20 at % to about 100 at %, or in the range of about 40 at % to about 60 at %. Alternatively or additionally, a thickness t1 of the first ferromagnetic layer 111 and a thickness t3 of the second ferromagnetic layer 113 may vary depending on ferromagnetic metals and non-magnetic metals used in the first ferromagnetic layer 111 and the second ferromagnetic layer 113 and their compositions, but the thicknesses t1 and t3 may be the same or different from one another, and may generally equal to or less than about 10 nm. For example, the thickness t1 of the first ferromagnetic layer 111 and the thickness t3 of the second ferromagnetic layer 113 may be in the range of about 1 nm to about 10 nm. Alternatively or additionally, a thickness t2 of the non-magnetic layer 112 may be, for example, in the range of about 0.1 nm to about 10 nm. When the thickness t1 of the first ferromagnetic layer 111 and the thickness t3 of the second ferromagnetic layer 113 are extremely great, the first ferromagnetic layer 111 and the second ferromagnetic layer 113 may be in the AFC region and/or may have in-plane magnetic anisotropy beyond the AFC region. Alternatively, when the thickness t1 of the first ferromagnetic layer 111 and the thickness t3 of the second ferromagnetic layer 113 are extremely small, the ferromagnetic layer 111 and the second ferromagnetic layer 113 may have strong PMA.

According to some example embodiments, the inclination angle θ of the magnetic anisotropy of the first ferromagnetic layer 111 with respect to the first direction (Y direction) may be between, for example, about 1 degrees to about 30 degrees, or about 5 degrees to about 10 degrees. The second ferromagnetic layer 113 may have normal PMA or may have inclined PMA. In consideration of this point, the inclination angle θ of magnetic anisotropy of the second ferromagnetic layer 113 with respect to the first direction (Y direction) may be, for example, 0 degree to about 20 degrees, or 0 degree to about 10 degrees.

Figure 3A:
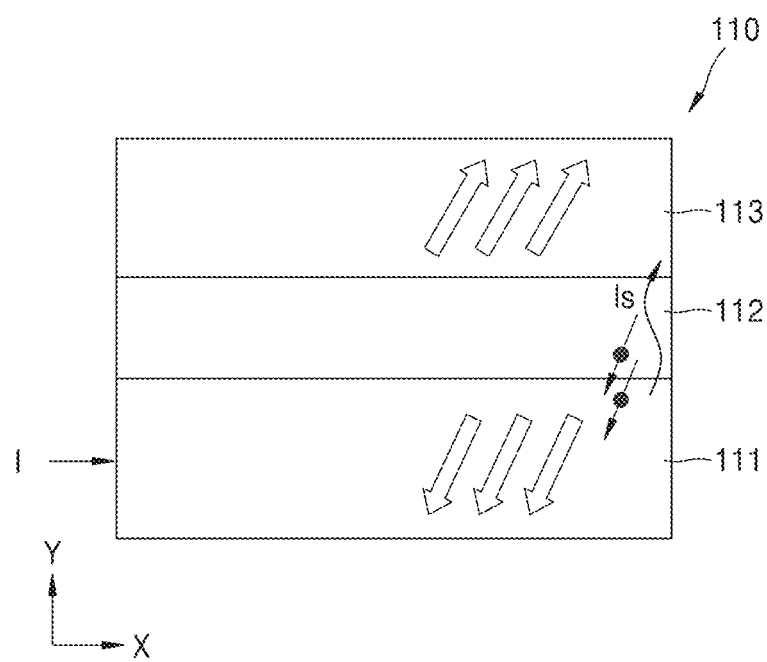
FIGS. 3A and 3B are schematic diagrams illustrating magnetic switching based on a spin-orbit torque generated by a synthetic antiferromagnet according to some example embodiments.
Figure 3B:
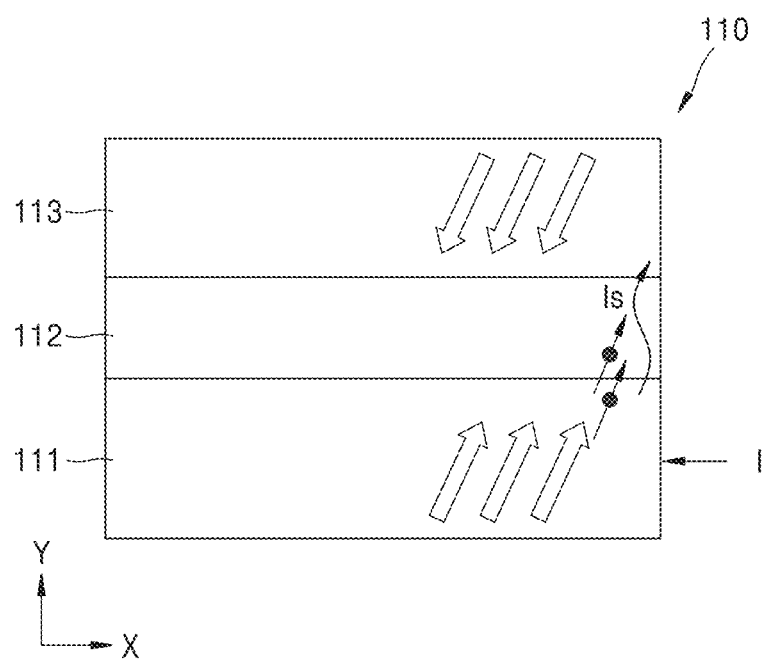

FIGS. 3A and 3B are schematic diagrams illustrating magnetic switching based on a spin-orbit torque generated by the synthetic antiferromagnet 110 according to some example embodiments. Referring to FIGS. 3A and 3B, selective magnetic switching of the second ferromagnetic layer 113 may be possible by applying a current to the first ferromagnetic layer 111, without application of an external magnetic field. When the current is applied to the first ferromagnetic layer 111, a spin current Is may be generated. In the synthetic antiferromagnet 110 according to some example embodiments, the spin current Is includes a spin Hall current and a spin anomalous Hall current. The spin Hall current is a spin current due to the spin Hall effect generated based on a spin-orbit interaction in a ferromagnetic metal and a non-magnetic metal. Also, the spin anomalous Hall current is a spin current due to the spin anomalous Hall effect generated based on the spin-orbit interaction of a ferromagnetic metal.

The spin anomalous Hall current may have a spin polarization in a direction parallel to the magnetization direction of the first ferromagnetic layer 111. Accordingly, due to the spin anomalous Hall effect, the spin current Is may have a polarization direction in the same direction as the magnetization direction of the first ferromagnetic layer 111. The first ferromagnetic layer 111 has a magnetization direction inclined with respect to the first direction (Y direction), and thus the polarization direction of the spin current Is may also be inclined with respect to the first direction (Y direction). This inclined polarization direction may act as the spin-orbit torque and contribute to magnetic switching of the second ferromagnetic layer 113. According to some example embodiments, when a current equal to or greater than a threshold current is applied to the first ferromagnetic layer 111, the magnetization direction of the second ferromagnetic layer 113 may be switched. Accordingly, the synthetic antiferromagnet 110 may operate without application of the external magnetic field.

The magnetization directions of the first ferromagnetic layer 111 and the second ferromagnetic layer 113 may be determined by a direction of the current applied to the first ferromagnetic layer 111. For example, when a current is applied to the first ferromagnetic layer 111 in a +X direction, the first ferromagnetic layer 111 may have a magnetization direction in a −Y direction and the second ferromagnetic layer 113 may have a magnetization direction in the +Y direction. When a current is applied to the first ferromagnetic layer 111 in the −X direction, the first ferromagnetic layer 111 may have a magnetization direction in the +Y direction and the second ferromagnetic layer 113 may have a magnetization direction in the −Y direction. Here, the magnetization direction in the +Y direction or the −Y direction does not mean or indicate that the magnetization direction is completely parallel to the +Y direction or the −Y direction, but means or indicates that the magnetization direction has a component in the +Y direction or a component in the −Y direction.

Figure 4A:
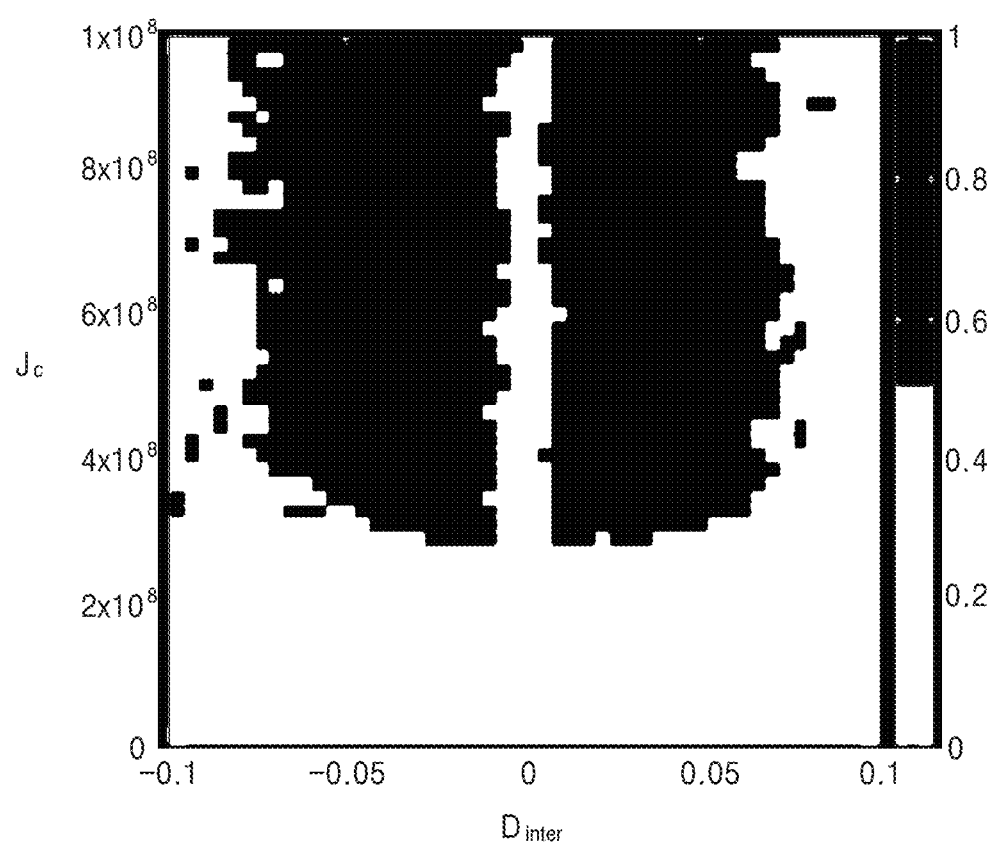
FIGS. 4A and 4B are graphs illustrating simulation results of magnetic switching based on a spin-orbit torque generated by a synthetic antiferromagnet according to some example embodiments.
Figure 4B:
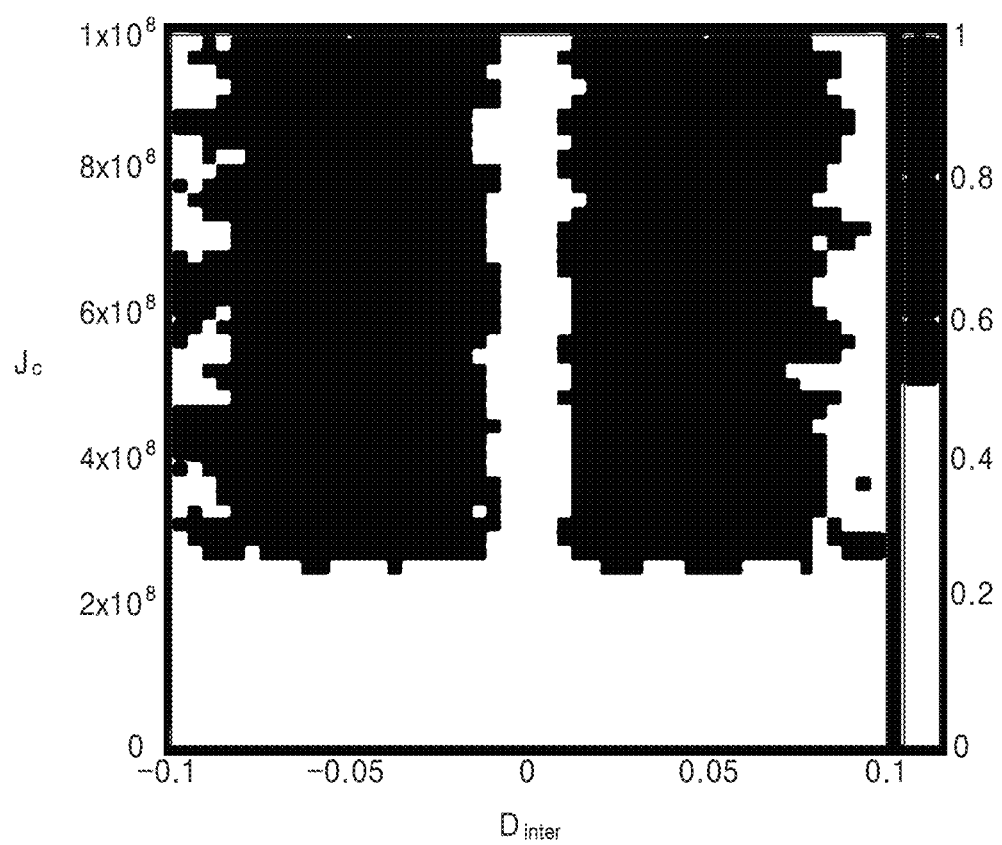

FIGS. 4A and 4B are graphs illustrating simulation results of magnetic switching based on a spin-orbit torque generated by the synthetic antiferromagnet 110 according to some example embodiments. In FIGS. 4A and 4B, the horizontal axis represents the intensity of the Zarosinski-Moriya interaction, and the vertical axis represents the current density applied to the first ferromagnetic layer 111. In addition, FIG. 4A shows a case where a value $\theta_{SAH}$ representing intensity of a spin anomalous Hall current as a dimensionless constant is −1 and a value $\theta_{SH}$ representing intensity of the spin Hall current as a dimensionless constant is +0.5, and FIG. 4B shows a case where $\theta_{SAH}$ is +1 and $\theta_{SH}$ is +0.5. In FIGS. 4A and 4B, a white region is a region in which a probability of magnetic switching is 1, and a black region is a region in which the probability of magnetic switching is 0. As may be seen from FIGS. 4A and 4B, when a spin anomalous Hall current having a spin polarization direction inclined with respect to the first direction (Y direction) is present, and when a current density greater than or equal to a specific value is applied to the first ferromagnetic layer 111, selective magnetic switching of the first ferromagnetic layer 111 and the second ferromagnetic layer 113 may be possible. In particular, when an absolute value of the value $\theta_{SH}$ representing the intensity of the spin Hall current as a dimensionless constant is greater than an absolute value of the value $\theta_{SH}$ representing the intensity of the spin Hall current as a dimensionless constant, selective magnetic switching may easily occur.

Figure 5:
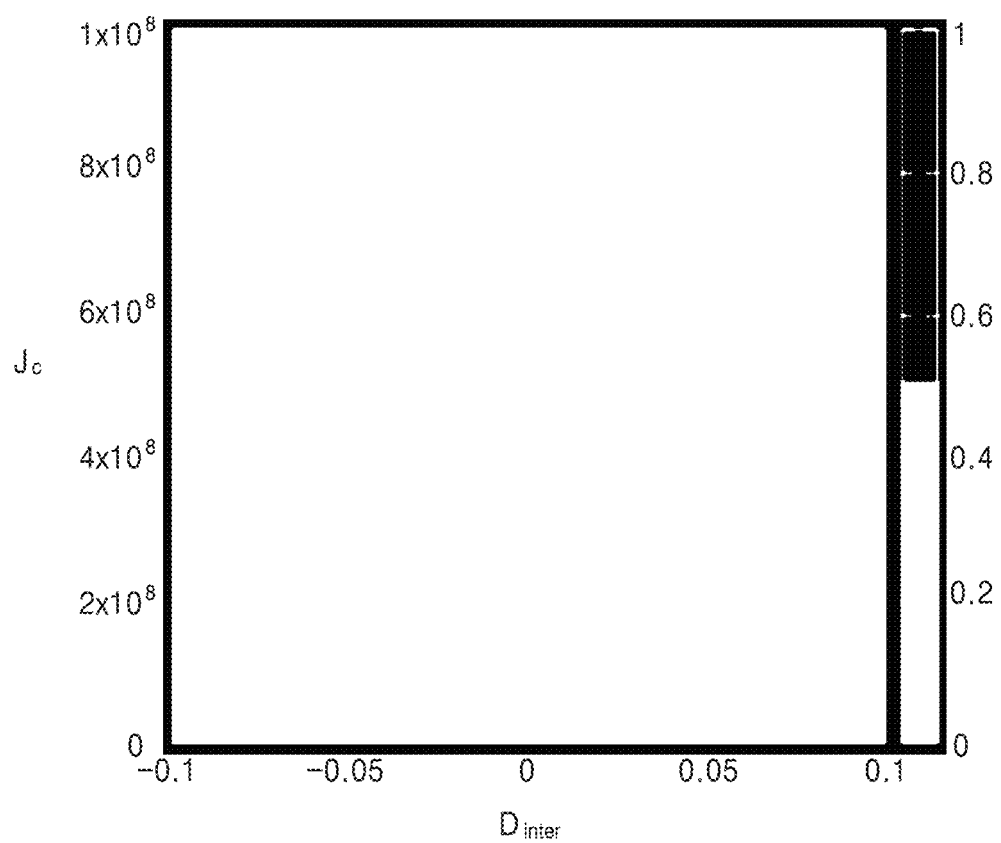
FIG. 5 is a graph illustrating simulation results of magnetic switching based on a spin-orbit torque generated by a synthetic antiferromagnet according to a comparative example.

FIG. 5 is a graph illustrating simulation results of magnetic switching based on a spin-orbit torque generated by a synthetic antiferromagnet according to a comparative example. The synthetic antiferromagnet according to the comparative example has PMA in which a first ferromagnetic layer and a second ferromagnetic layer are not inclined. As may be seen from FIG. 5, when the synthetic antiferromagnet has general PMA, magnetic switching does not occur even when a spin current is generated by applying a current to the first ferromagnetic layer. This may be because a spin-orbit torque does not act on the first ferromagnetic layer and the second ferromagnetic layer since there is no spin anomalous Hall current having a spin polarization direction inclined with respect to the first direction (Y direction).

From another point of view, when the first ferromagnetic layer and the second ferromagnetic layer have PMA that is not inclined, random magnetic switching may occur due to structural symmetry. In the synthetic antiferromagnet 110 according to various example embodiments, the inclined PMA may cause symmetry breaking to enable selective magnetic switching. Accordingly, selective magnetic switching may occur without applying a separate external magnetic field to the synthetic antiferromagnet 110 to cause symmetry breaking. In this regard, it may be seen that the first ferromagnetic layer 111 of the synthetic antiferromagnet 110 having the inclined PMA acts in place of the external magnetic field.

Figure 6:
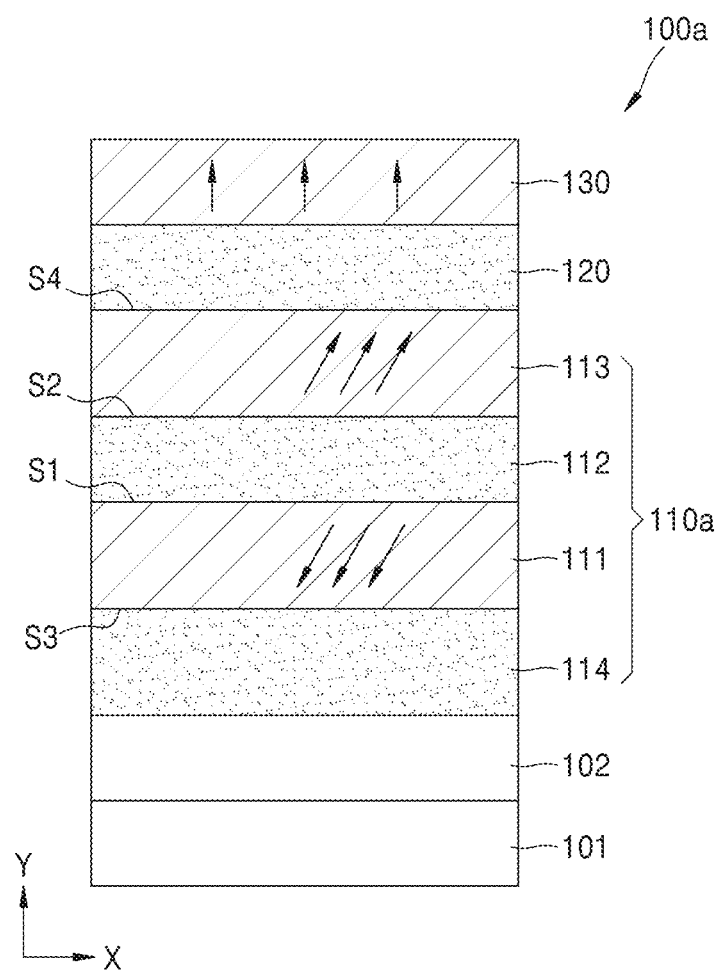
FIG. 6 is a cross-sectional view illustrating schematic structures of a synthetic antiferromagnet and a magnetic tunneling junction device according to another embodiment.

FIG. 6 is a cross-sectional view illustrating schematic structures of a synthetic antiferromagnet 110a and a magnetic tunneling junction device 100a according to some example embodiments. Referring to FIG. 6, a magnetic tunneling junction device 100a according to another embodiment may include the synthetic antiferromagnet 110a, the oxide layer 120 disposed on the synthetic antiferromagnet 110a, and the pinned layer 130 disposed on the oxide layer 120. The synthetic antiferromagnet 110a may include the first ferromagnetic layer 111 having the first surface S1, the second ferromagnetic layer 113 having the second surface S2 facing the first surface S1 of the first ferromagnetic layer 111, the first non-magnetic layer 112 disposed between the first ferromagnetic layer 111 and the second ferromagnetic layer 113, and the second non-magnetic layer 114 disposed on the third surface S3 opposite to the first surface S1 of the first ferromagnetic layer 111.

The second non-magnetic layer 114 may include a transition metal that generates Dzyaloshinskii-Moriya interaction on an interface with the first ferromagnetic layer 111. For example, the second non-magnetic layer 114 may include one of platinum (Pt), tungsten (W), tantalum (Ta), and an alloy including the same. When a current is applied to the first ferromagnetic layer 111, a spin current may be additionally generated due to the Dzyaloshinskii-Moriya interaction occurring on the interface between the second non-magnetic layer 114 and the first ferromagnetic layer 111, and this spin current may further increase a spin-orbit torque. Accordingly, the second non-magnetic layer 114 may further improve a magnetic switching efficiency of the synthetic antiferromagnet 110a.

Additionally or alternatively, in order to further improve the magnetic switching efficiency of the synthetic antiferromagnet 110a, it may be desirable or advantageous that as much current as possible flows through the first ferromagnetic layer 111. For example, materials and/or thicknesses of the first ferromagnetic layer 111, the first non-magnetic layer 112, the second ferromagnetic layer 113, the second non-magnetic layer 114, the buffer layer 102, and the seed layer 101 may be selected so that at least 30% of the total current applied to the synthetic antiferromagnet 110a flows through the first ferromagnetic layer 111. To this end, the thickness of the second ferromagnetic layer 113 may be greater than the thickness of the first ferromagnetic layer 111. Then, more current may flow through the first ferromagnetic layer 111 to increase the spin-orbit torque. For example, the thickness of the first ferromagnetic layer 111 may be in the range of about 1 nm to about 5 nm, and the thickness of the second ferromagnetic layer 113 may be in the range of about 1 nm to about 10 nm.

Alternatively or additionally, the materials of the first ferromagnetic layer 111 and the second ferromagnetic layer 113 may be differently selected so that the first ferromagnetic layer 111 has higher electrical conductivity than that of the second ferromagnetic layer 113. An intensity of the Dzyaloshinskii-Moriya interaction occurring on the interface between the first non-magnetic layer 112 and the first ferromagnetic layer 111 may be different from an intensity of the Dzyaloshinskii-Moriya interaction occurring on the interface between the first non-magnetic layer 112 and the second ferromagnetic layer 113. For example, the materials and/or thicknesses of the first ferromagnetic layer 111 and the second ferromagnetic layer 113 may be differently selected so that the intensity of the Dzyaloshinskii-Moriya interaction occurring on the interface between the first non-magnetic layer 112 and the second ferromagnetic layer 113 may be greater than the intensity of the Dzyaloshinskii-Moriya interaction occurring on the interface between the first non-magnetic layer 112 and the first ferromagnetic layer 111. In addition, materials and/or thicknesses of the first non-magnetic layer 112, the second non-magnetic layer 114, the buffer layer 102, and the seed layer 101 may be selected so that more current may flow through the first ferromagnetic layer 111.

The above-described magnetic tunneling junction devices 100 and 100a may have a relatively low resistance when a magnetization direction of the pinned layer 130 and a magnetization direction of the second ferromagnetic layer 113 are the same, and may have a relatively a high resistance when the magnetization directions are different from each other. Here, magnetization directions being the same does not mean magnetization directions being completely parallel to each other, when both magnetization directions of the pinned layer 130 and the second ferromagnetic layer 113 have a component in +Y direction or a component in −Y direction, magnetization directions may be considered as being the same, and when one of magnetization directions of the pinned layer 130 and the second ferromagnetic layer 113 have the component in +Y direction and the other one has the component in −Y direction, magnetization directions may be considered as being opposite to each other. This phenomenon is called tunneling magnetoresistance (TMR). The magnetic tunneling junction device 100 may be used in a memory device by applying this TMR phenomenon.

Figure 7:
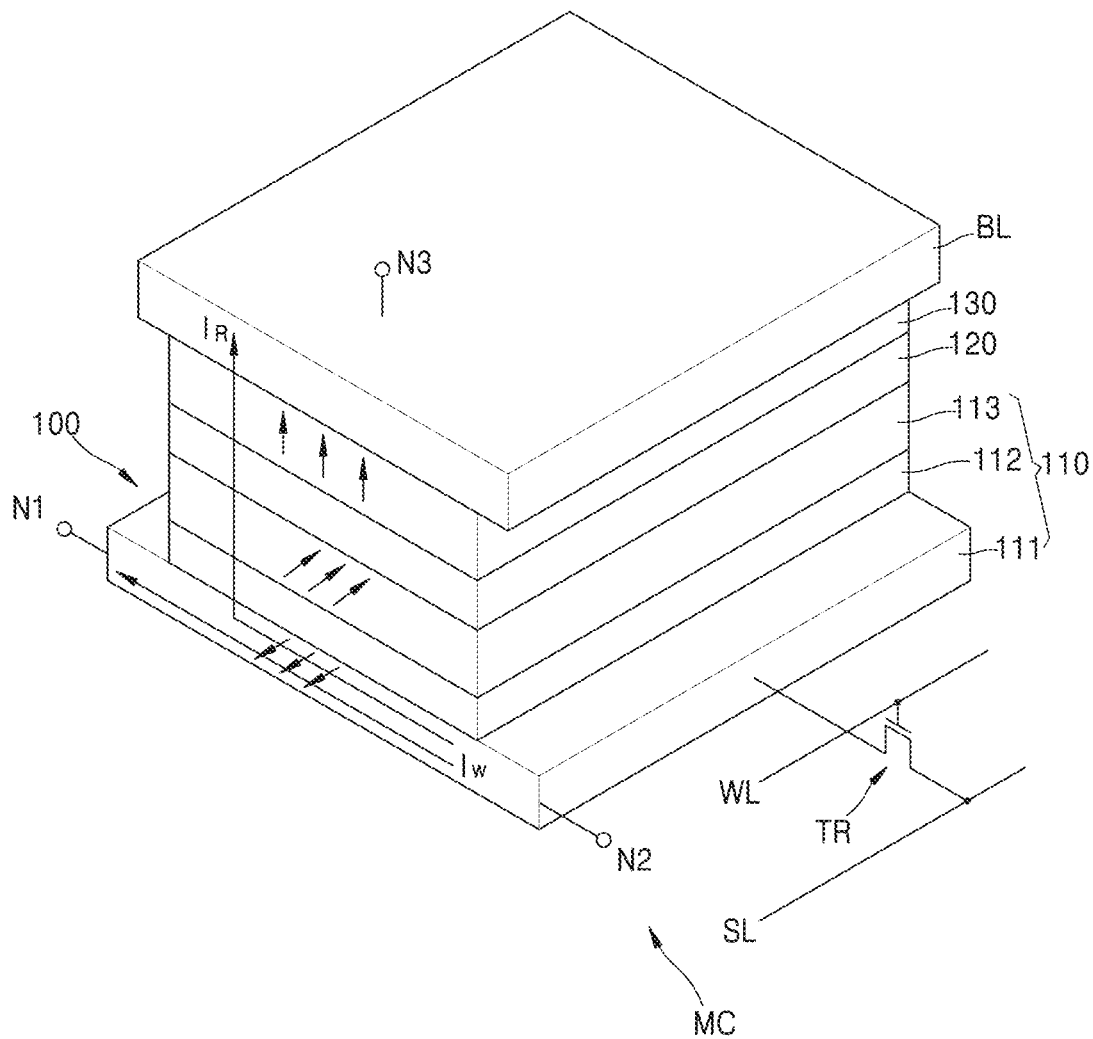
FIG. 7 schematically shows a memory cell including a magnetic tunneling junction device according to some example embodiments.

FIG. 7 schematically shows a memory cell including the magnetic tunneling junction device 100 according to some example embodiments. Referring to FIG. 7, the memory cell MC may include the magnetic tunneling junction device 100 and a switching device TR connected to the magnetic tunneling junction device 100. The switching device TR may be or may include a transistor such as a field effect transistor such as a thin film transistor, and may be an NMOS transistor; however, example embodiments are not limited thereto. The memory cell MC may be connected between a bit line BL and a word line WL. The bit line BL and the word line WL may be disposed to cross each other, and the memory cell MC may be disposed in an intersection point of the bit line BL and the word line WL. The bit line BL may be electrically connected to the pinned layer 130 of the magnetic tunneling junction device 100 and the word line WL may be connected to a gate of the switching device TR. In addition, a first source/drain electrode of the switching device TR may be electrically connected to the synthetic antiferromagnet 110 that is a free layer of the magnetic tunneling junction device 100 and a second source/drain electrode of the switching device TR may be electrically connected to a selection line SL. The first source/drain electrode of the switching device TR may be electrically connected to, in particular, the ferromagnetic layer 111. In FIG. 7, it is shown that the memory cell MC may include the magnetic tunneling junction device 100 shown in FIG. 1, but in some example embodiments, the memory cell MC may include the magnetic tunneling junction device 100*a* shown in FIG. 6.

In this structure, one or more of a write current, a read current, an erase current, etc. may be applied to the memory cell MC through the word line WL and the bit line BL. For example, the write current and the erase current equal to or greater than the threshold current may flow through a path between a first node N1 and a second node N2 on both sides of the first ferromagnetic layer 111. To this end, the first source/drain electrode of the switching device TR may be connected to the second node N2 of the first ferromagnetic layer 111. Although not shown, a ground electrode may be connected to the first node N1 of the first ferromagnetic layer 111. Then, a magnetization direction of the first ferromagnetic layer 111 may change in the +Y direction or the −Y direction according to a direction of the current applied to the first ferromagnetic layer 111. Also, a magnetization direction of the second ferromagnetic layer 113 may change in the −Y direction or the +Y direction according to the magnetization direction of the first ferromagnetic layer 111. For example, the magnetization direction of the second ferromagnetic layer 113 may change in a direction opposite to the magnetization direction of the first ferromagnetic layer 111. Also, the read current may flow through a path between the second node N2 of the first ferromagnetic layer 111 and a third node N3 of the pinned layer 130. For example, a resistance value of the magnetic tunneling junction device 100 may be read by applying a current lower than the threshold current to the second node N2 of the first ferromagnetic layer 111 and measuring the current flowing between the first ferromagnetic layer 111 and the bit line BL.

Figure 8:
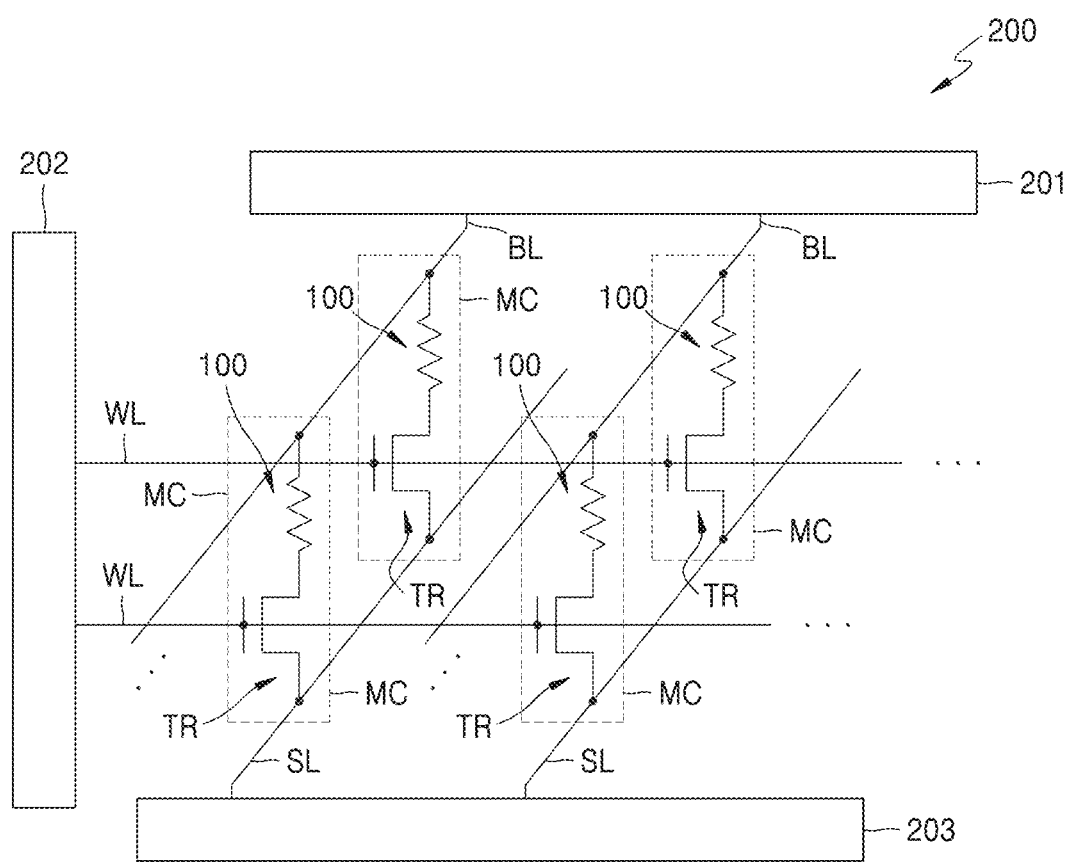
FIG. 8 is a circuit diagram schematically illustrating a configuration of a memory device including a plurality of memory cells shown in FIG. 7.

FIG. 8 is a circuit diagram schematically illustrating a configuration of a memory device 200 including the plurality of memory cells MCs shown in FIG. 7. Referring to FIG. 8, the memory device 200 may include a plurality of bit lines BL, a plurality of word lines WL, a plurality of selection lines SL, the plurality of memory cells MCs respectively disposed in intersection points of the plurality of bit lines BL and the plurality of word lines WL, a bit line driver 201 applying current to the plurality of bit lines BL, a word line driver 202 applying current to the plurality of word lines WL and a selection line driver 203 applying current to the plurality of selection lines SL. Each memory cell MC may have the configuration shown in FIG. 7. The memory device 200 illustrated in FIG. 8 may be or may be referred to as a magnetic random access memory (MRAM), and may be used in electronic devices using nonvolatile memory. In particular, the memory device 200 illustrated in FIG. 8 may be a SOT-MRAM. The memory device 200 may be referred to as a 1T1MTJ device (e.g. a one-transistor, one magnetic tunneling junction) memory device.

Figure 9:
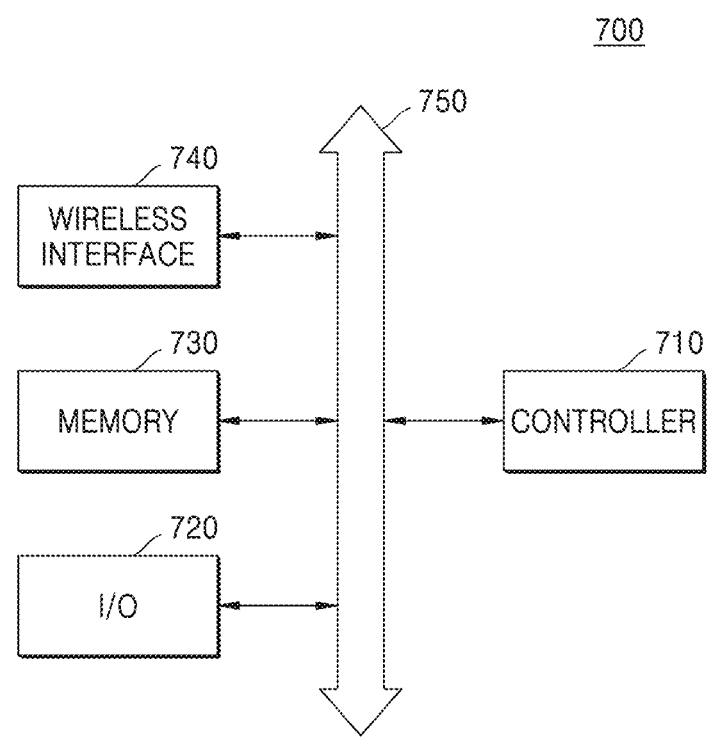
FIG. 9 is a block diagram of an electronic apparatus according to some example embodiments.

FIG. 9 is a block diagram of an electronic apparatus 700 according to some example embodiments. Referring to FIG. 9, an electronic apparatus 700 may constitute a wireless communication device, or a device capable of transmitting and/or receiving information in a wireless environment. The electronic apparatus 700 includes a controller 710, an input/output (I/O) device 720, a memory 730, and a wireless interface 740, which are interconnected through a bus 750.

The controller 710 may include at least one of a microprocessor, a digital signal processor, or a processing apparatus similar thereto. The I/O device 720 may include at least one of a keypad, a keyboard, and a display. The memory 730 may be used to store commands executed by controller 710. For example, the memory 730 may be used to store user data.

In some example embodiments, the memory 730 may include a magnetic tunneling junction device such as one or more of the magnetic tunneling junction devices 100 described above.

The electronic apparatus 700 may use the wireless interface 740 to transmit/receive data through a wireless communication network. The wireless interface 740 may include an antenna and/or a wireless transceiver. In some embodiments, the electronic apparatus 700 may be used for a communication interface protocol of a third generation communication system, for example, one or more of a code division multiple access (CDMA), a global system for mobile communications (GSM), a north American digital cellular (NADC), an extended-time division multiple access (E-TDMA), and/or a wide band code division multiple access (WCDMA).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of example embodiments. Moreover, when the words "generally" and "substantially" are used in connection with material composition, it is intended that exactitude of the material is not required but that latitude for the material is within the scope of various example embodiments.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

The above-described synthetic antiferromagnet, the magnetic tunneling junction device including the synthetic antiferromagnet, and the memory device including the magnetic tunneling junction device have been described with reference to the embodiments shown in the drawings, but this is one for examples, and it will be understood by those of ordinary skill in the art that various modifications and other equivalent embodiments may be made therein. Therefore, various example embodiments of the disclosure should be considered in a descriptive sense only and not for purposes of limitation. The scope of the rights is indicated in the claims rather than the above description, and all differences within the scope equivalent thereto should be interpreted as being included in the scope of the rights.

It should be understood that various example embodiments described herein should be considered in a descriptive sense only and not for purposes of limitation. Descriptions of features or aspects within each embodiment should typically be considered as available for other similar features or aspects in other example embodiments, and embodiments are not necessarily mutually exclusive. While one or more embodiments have been described with reference to the figures, it will be understood by those of ordinary skill in the art that various changes in form and details may be made therein without departing from the spirit and scope as defined by the following claims.

What is claimed is:

1. A synthetic antiferromagnet comprising:
a first ferromagnetic layer having a first surface;
a second ferromagnetic layer having a second surface facing the first surface of the first ferromagnetic layer; and
a first non-magnetic layer between the first ferromagnetic layer and the second ferromagnetic layer,
wherein the first ferromagnetic layer has an inclined perpendicular magnetic anisotropy (PMA) in which a magnetization direction of the first ferromagnetic layer is inclined from a first direction that is perpendicular to the first surface and the second surface,
a first component in the first direction of the magnetization direction of the first ferromagnetic layer and a second component in the first direction of the magnetization direction of the second ferromagnetic layer are opposite to each other, and
the first ferromagnetic layer has higher electrical conductivity than electrical conductivity of the second ferromagnetic layer.

2. The synthetic antiferromagnet of claim 1, wherein
the magnetization direction of the first ferromagnetic layer is configured to change according to a direction of a current applied to the first ferromagnetic layer, and
the magnetization direction of the second ferromagnetic layer is configured to change according to the magnetization direction of the first ferromagnetic layer.

3. The synthetic antiferromagnet of claim 1, wherein the second ferromagnetic layer has an inclined PMA in which the magnetization direction of the second ferromagnetic layer is inclined from the first direction.

4. The synthetic antiferromagnet of claim 3, wherein the magnetization direction of the first ferromagnetic layer and the magnetization direction of the second ferromagnetic layer are antiparallel to each other.

5. The synthetic antiferromagnet of claim 3, wherein, a direction parallel to the first surface and the second surface being defined as a second direction, a third component in the second direction of the magnetization direction of the first ferromagnetic layer and a fourth component in the second direction of the magnetization direction of the second ferromagnetic layer are opposite to each other.

6. The synthetic antiferromagnet of claim 1, wherein an inclination angle of magnetic anisotropy of the first ferromagnetic layer with respect to the first direction is 1 degrees to 30 degrees.

7. The synthetic antiferromagnet of claim 1, wherein the first non-magnetic layer comprises a conductive metal having a Dzyaloshinskii-Moriya interaction with the first ferromagnetic layer and the second ferromagnetic layer.

8. The synthetic antiferromagnet of claim 7, wherein an intensity of the Dzyaloshinskii-Moriya interaction on an interface between the first non-magnetic layer and the first ferromagnetic layer is different from an intensity of the Dzyaloshinskii-Moriya interaction on an interface between the first non-magnetic layer and the second ferromagnetic layer.

9. The synthetic antiferromagnet of claim 7, wherein the first non-magnetic layer comprises at least one of ruthenium (Ru), aluminum (Al), tantalum (Ta), platinum (Pt), tungsten (W), palladium (Pd), zirconium (Zr), copper (Cu), or an alloy containing the same.

10. The synthetic antiferromagnet of claim 1, wherein a thickness of the first non-magnetic layer is in the range of 0.1 nm to 10 nm.

11. The synthetic antiferromagnet of claim 1, wherein each of the first ferromagnetic layer and the second ferromagnetic layer comprises an alloy of a ferromagnetic metal and a non-magnetic metal.

12. The synthetic antiferromagnet of claim 11, wherein the ferromagnetic metal comprises at least one of iron (Fe), cobalt (Co), or nickel (Ni), and the non-magnetic metal comprises at least one of boron (B), silicon (Si), zirconium (Zr), platinum (Pt), palladium (Pd), copper (Cu), or tungsten (W).

13. The synthetic antiferromagnet of claim 11, wherein a ratio of the ferromagnetic metal in each of the first ferromagnetic layer and the second ferromagnetic layer is in the range of 20 at % to 100 at %.

14. The synthetic antiferromagnet of claim 11, wherein a thickness of the first ferromagnetic layer is 1 nm to 10 nm and a thickness of the second ferromagnetic layer is 1 nm to 10 nm.

15. The synthetic antiferromagnet of claim 1, wherein a thickness of the second ferromagnetic layer is greater than a thickness of the first ferromagnetic layer.

16. The synthetic antiferromagnet of claim 1, further comprising:
a second non-magnetic layer on a third surface opposite the first surface of the first ferromagnetic layer,
wherein the second non-magnetic layer comprises a transition metal having a Dzyaloshinskii-Moriya interaction with the first ferromagnetic layer.

17. The synthetic antiferromagnet of claim 16, wherein the second non-magnetic layer comprises at least one of platinum (Pt), tungsten (W), tantalum (Ta), or an alloy containing same.

18. A magnetic tunneling junction device comprising:
a pinned layer having a fixed magnetization direction;
a synthetic antiferromagnet having a variable magnetization direction; and
an oxide layer between the pinned layer and the synthetic antiferromagnet,
wherein the synthetic antiferromagnet comprises:
a first ferromagnetic layer having a first surface;
a second ferromagnetic layer having a second surface facing the first surface of the first ferromagnetic layer; and
a first non-magnetic layer between the first ferromagnetic layer and the second ferromagnetic layer,
wherein the first ferromagnetic layer has an inclined perpendicular magnetic anisotropy (PMA) in which a magnetization direction of the first ferromagnetic layer is inclined from a first direction perpendicular to the first surface and the second surface,
a first component in the first direction of the magnetization direction of the first ferromagnetic layer and a second component in the first direction of a magnetization direction of the second ferromagnetic layer are opposite to each other,
the synthetic antiferromagnet is arranged so that the second ferromagnetic layer is adjacent to the oxide layer, and
the first ferromagnetic layer has higher electrical conductivity than electrical conductivity of the second ferromagnetic layer.

19. The magnetic tunneling junction device of claim 18, wherein the magnetization direction of the first ferromagnetic layer is configured to change according to a direction of a current applied to the first ferromagnetic layer, and the magnetization direction of the second ferromagnetic layer is configured to change according to the magnetization direction of the first ferromagnetic layer.

20. The magnetic tunneling junction device of claim 18, wherein the second ferromagnetic layer has an inclined PMA in which the magnetization direction of the second ferromagnetic layer is inclined from the first direction perpendicular to the first surface and the second surface.

21. The magnetic tunneling junction device claim of 20, wherein the magnetization direction of the first ferromagnetic layer and the magnetization direction of the second ferromagnetic layer are antiparallel to each other.

22. The magnetic tunneling junction device of claim 20, wherein, a direction parallel to the first surface and the second surface being defined as a second direction, a third component in the second direction of the magnetization direction of the first ferromagnetic layer and a fourth component in the second direction of the magnetization direction of the second ferromagnetic layer are opposite to each other.

23. The magnetic tunneling junction device of claim 18, wherein an inclination angle of magnetic anisotropy of the first ferromagnetic layer with respect to the first direction is 1 degrees to 30 degrees.

24. The magnetic tunneling junction device of claim 18, wherein the first non-magnetic layer comprises a conductive metal having a Dzyaloshinskii-Moriya interaction with the first ferromagnetic layer and the second ferromagnetic layer.

25. The magnetic tunneling junction device of claim 24, wherein an intensity of the Dzyaloshinskii-Moriya interaction on an interface between the first non-magnetic layer and the first ferromagnetic layer is different from an intensity of the Dzyaloshinskii-Moriya interaction on an interface between the first non-magnetic layer and the second ferromagnetic layer.

26. The magnetic tunneling junction device of claim 24, wherein the first non-magnetic layer comprises at least one of ruthenium (Ru), aluminum (Al), tantalum (Ta), platinum (Pt), tungsten (W), palladium (Pd), zirconium (Zr), copper (Cu), or an alloy containing the same.

27. The magnetic tunneling junction device of claim 18, wherein a thickness of the first non-magnetic layer is in the range of 0.1 nm to 10 nm.

28. The magnetic tunneling junction device of claim 18, wherein each of the first ferromagnetic layer and the second ferromagnetic layer comprises an alloy of a ferromagnetic metal and a non-magnetic metal.

29. The magnetic tunneling junction device of claim 28, wherein the ferromagnetic metal comprises at least one of iron (Fe), cobalt (Co), or nickel (Ni), and the non-magnetic metal comprises at least one of boron (B), silicon (Si), zirconium (Zr), platinum (Pt), palladium (Pd), copper (Cu), or tungsten (W).

30. The magnetic tunneling junction device of claim 28, wherein a ratio of the ferromagnetic metal in each of the first ferromagnetic layer and the second ferromagnetic layer is in the range of 20 at % to 100 at %.

31. The magnetic tunneling junction device of claim 18, wherein a thickness of the first ferromagnetic layer is in a range of 1 nm to 10 nm and a thickness of the second ferromagnetic layer is in a range of 1 nm to 10 nm.

32. The magnetic tunneling junction device of claim 18, wherein a thickness of the second ferromagnetic layer is greater than a thickness of the first ferromagnetic layer.

33. The magnetic tunneling junction device of claim 18, further comprising:
a second non-magnetic layer on a third surface opposite the first surface of the first ferromagnetic layer,
wherein the second non-magnetic layer comprises a transition metal having a Dzyaloshinskii-Moriya interaction with the first ferromagnetic layer.

34. The magnetic tunneling junction device of claim 33, wherein the second non-magnetic layer comprises at least one of platinum (Pt), tungsten (W), tantalum (Ta), or an alloy containing same.

35. A memory device comprising:
a plurality of memory cells each comprising a magnetic tunneling junction device and a switching device connected to the magnetic tunneling junction device,
wherein the magnetic tunneling junction device comprises
a pinned layer having a fixed magnetization direction;
a synthetic antiferromagnet having a variable magnetization direction; and
an oxide layer disposed between the pinned layer and the synthetic antiferromagnet,
wherein the synthetic antiferromagnet comprises:
a first ferromagnetic layer having a first surface;
a second ferromagnetic layer having a second surface facing the first surface of the first ferromagnetic layer; and
a first non-magnetic layer between the first ferromagnetic layer and the second ferromagnetic layer,
wherein the first ferromagnetic layer has an inclined perpendicular magnetic anisotropy (PMA) in which a magnetization direction of the first ferromagnetic layer is inclined from a first direction that is perpendicular to the first surface and the second surface,
a first component in the first direction of the magnetization direction of the first ferromagnetic layer and a second component in the first direction of a magnetization direction of the second ferromagnetic layer are opposite to each other,
the synthetic antiferromagnet is arranged so that the second ferromagnetic layer is adjacent to the oxide layer, and
the first ferromagnetic layer has higher electrical conductivity than electrical conductivity of the second ferromagnetic layer.

36. A synthetic antiferromagnet comprising:
a first ferromagnetic layer having a first surface; and
a second ferromagnetic layer having a second surface facing the first surface of the first ferromagnetic layer,
wherein the first ferromagnetic layer has an inclined perpendicular magnetic anisotropy (PMA) in which a magnetization direction of the first ferromagnetic layer is inclined from a first direction that is perpendicular to the first surface and the second surface, and
a first component of a projection of the magnetization direction of the first ferromagnetic layer onto the first direction and a second component in the first direction of a projection of the magnetization direction of the second ferromagnetic layer are antiparallel with each other,
the first ferromagnetic layer has higher electrical conductivity than electrical conductivity of the second ferromagnetic layer.

* * * * *